(12) United States Patent
Banno

(10) Patent No.: US 8,092,929 B2
(45) Date of Patent: Jan. 10, 2012

(54) OPTICAL ELEMENT AND EXPOSURE APPARATUS

(75) Inventor: Keisui Banno, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 827 days.

(21) Appl. No.: 12/186,138

(22) Filed: Aug. 5, 2008

(65) Prior Publication Data

US 2009/0061214 A1 Mar. 5, 2009

(30) Foreign Application Priority Data

Aug. 27, 2007 (JP) ................................. 2007-219145

(51) Int. Cl.
*B32B 9/00* (2006.01)
*G03B 27/54* (2006.01)
*G02B 17/00* (2006.01)

(52) U.S. Cl. ........... 428/701; 428/702; 359/726; 355/67

(58) Field of Classification Search .................. None
See application file for complete search history.

(56) References Cited

FOREIGN PATENT DOCUMENTS
JP 2006-179759 A 7/2006

OTHER PUBLICATIONS

Julius Santillan, et al., "Novel High Refractive Index Fluids for 193-nm immersion lithography," Optical Microlithography XIX, edited by Donis G. Flagello, Proc. of SPIE vol. 6154, 61544Q, (2006).
John H. Burnett, et al., "High-index optical materials for 193 nm immersion lithography," Optical Microlithography XIX, edited by Donis G. Flagello, Proc. of SPIE vol. 6154, 615418, (2006).
Roger H. French, et al., "Second generation fluids for 193 nm immersion lithography," Optical Microlithography XIX, edited by Donis G. Flagello, Proc. of SPIE vol. 6154, 615415, (2006).
Julius Santillan, et al., "Novel High Refractive Index Fluids for 193-mn immersion lithography," Optical Microlithography XIX, edited by Donis G. Flagello, Proc. of SPIE vol. 6154, 61544Q, (2006).
Yong Wang, et al.,"High-Refractive-Index Fluids for the Next Generation ArF Immersion Lithography," Advances in Resist Technology and Processing XXII, edited by Qinghuang Lin, Proc of SPIE, vol. 6153, 61530A, (2006).

*Primary Examiner* — Timothy Speer
(74) *Attorney, Agent, or Firm* — Fitzpatrick, Cella, Harper & Scinto

(57) ABSTRACT

An optical element is configured to have a base composed of a LuAg substrate having a refractive index of 2.14±0.01 for a wavelength of 193 nm and an antireflection film formed on the base, and the optical element being configured to contact a liquid having a refractive index of 1.64±0.01 for the wavelength of 193 nm. The antireflection film includes a high refractive index layer that is formed on the base, contains $Al_2O_3$ having a refractive index of 1.87 to 1.92 for the wavelength of 193 nm, and has an optical film thickness of $0.21\lambda$ to $0.34\lambda$ for a design center wavelength $\lambda$ of 193 nm and a low refractive index layer that is closer to the liquid than the high refractive index layer, contains $Al_2O_3$ having a refractive index equal to or smaller than 1.78 but larger than the refractive index of the liquid for the wavelength of 193 nm, and has an optical film thickness of $0.29\lambda$ to $0.52\lambda$ at the design center wavelength $\lambda$.

6 Claims, 5 Drawing Sheets

OPTICAL ELEMENT AND EXPOSURE APPARATUS

BACKGROUND OF THE INVENTION

1. Field of the Invention

The present invention relates generally to an optical element, and more particularly to an optical system and an exposure apparatus which has the optical element.

2. Description of the Related Art

A projection exposure apparatus configured to expose a pattern of an original (e.g., a reticle or a mask) on a substrate such as a wafer by using a projection optical system has been conventionally used, and immersion exposure has recently called attentions because it is one means for meeting the high-resolution demand. Since a numerical aperture ("NA") of a projection optical system is defined as NA=n×sin θ, where "n" is a refractive index of a medium on the substrate side, the NA can be increased up to a value equal to "n" by filling a gap between the projection optical system and the substrate with a medium having a refractive index greater than that of air (n>1). By using this approach, the immersion exposure attempts to reduce the resolution R ( ) of the exposure apparatus, which is defined as R=$k_1$×(λ/NA) where $k_1$ is a process constant, and λ is a wavelength of the light source.

In the recent immersion exposure, a development of a medium having a higher refractive index is sought. Some liquids are known which have refractive indices of 1.64±0.01 for use with a laser light from an ArF excimer laser having a wavelength of 193 nm. See Roger H. French, et al., "Second generation fluids for 193 nm immersion lithography," Optical Microlithography XIX, edited by Donis G. Flagello, Proc. of SPIE Vol. 6154, 615415, (2006), Yong Wang, et al., "High-Refractive-Index Fluids for the Next Generation ArF Immersion Lithography," Advances in Resist Technology and Processing XXII, edited by Qinghuang Lin, Proc of SPIE, Vol. 6153, 61530A, (2006), Julius Santillan, et al., "Novel High Refractive Index Fluids for 193-nm immersion lithography," Optical Microlithography XIX, edited by Donis G. Flagello, Proc. of SPIE Vol. 6154, 61544Q, (2006). The LuAg substrate having a refractive index of about 2.14 is also known as a glass material for a final lens in the projection optical system for use with the above high refractive index liquids. See John H. Burnett, et al., "High-index optical materials for 193 nm immersion lithography," Optical Microlithography XIX, edited by Donis G. Flagello, Proc. of SPIE vol. 6154, 615418, (2006). It is also known that a multilayer antireflection film which includes, in order from a lens base side, an $Al_2O_3$ film, a $SiO_2$ film, an $Al_2O_3$ film, and a $SiO_2$ film that are arranged in order of the distance from the lens base side, may be used when the medium is pure water. See claim 7 and Paragraph 0061 of Japanese Patent Laid-Open No. ("JP") 2006-179759. For a descriptive purpose, this application will let "193 nm" be the wavelength of the laser light from the ArF excimer laser although it is 193.4 nm, strictly speaking.

However, the antireflection film disclosed in claim 7 and paragraph 0061 of JP 2006-179759 may not be used with the high refractive index liquids disclosed in "second generation fluids for 193 nm immersion lithography,", "High-refractive-Index Fluids for the Next Generation ArF Immersion Lithography," and "Novel High Refractive Index Fluids for 193-nm immersion lithography," and cannot limit reflectances for an incident angle range between 0° and 70° to 1% or less, in the high refractive index liquid. Applying the antireflection film disclosed in claim 7 and paragraph 0061 of JP 2006-179759 to the high refractive index liquid disclosed in "second generation fluids for 193 nm immersion lithography," "High-refractive-Index Fluids for the Next Generation ArF Immersion Lithography," and "Novel High Refractive Index Fluids for 193-nm immersion lithography" will cause flare or ghost and worsen the imaging performance.

SUMMARY OF THE INVENTION

The present invention is directed to an exposure apparatus, an optical system, and an optical element that include a LuAg substrate for a lens material having a refractive index of 2.14±0.01, light having a wavelength of 193 nm, and a liquid having a refractive index of 1.64±0.01 and that have an antireflection film with advanced characteristic.

An optical element according to one aspect of the present invention, includes both a base composed of a LuAg substrate having a refractive index of 2.14±0.01 for a wavelength of 193 nm and an antireflection film formed with the base, and contacts a liquid having a refractive index of 1.64±0.01 for a wavelength of 193 nm. The antireflection film includes a high refractive index layer, one of layers formed on the base, which contains $Al_2O_3$ having a refractive index of 1.87 to 1.92 for a wavelength of 193 nm, and that has an optical film thickness of 0.21λ to 0.34λ at a design center wavelength "λ" (λ=193 nm) and a low refractive index layer closer to the liquid of the two layers on the base, which contains $Al_2O_3$ having a refractive index of 1.78 or less but exceeding that of the liquid for a wavelength of 193 nm, and that has an optical film thickness of 0.29λ to 0.52λ at a design center wavelength "λ" (λ=193 nm).

Further features of the present invention will become apparent from the following description of exemplary embodiments (with reference to the attached drawings).

DESCRIPTION OF THE EMBODIMENTS

Figure 1:
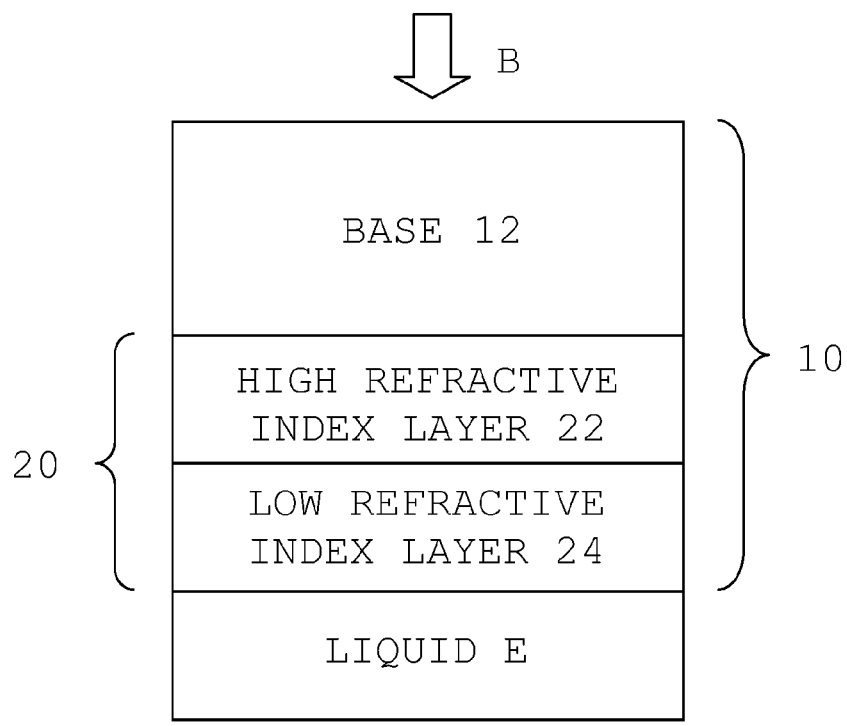
FIG. 1 is a schematic sectional view of an optical element according to one embodiment of the present invention.

FIG. 1 represents a schematic sectional view of an optical element 10 which is configured to contact a liquid E. The optical element 10 is used for a laser light B of the ArF excimer laser having a design center wavelength λ of approximately 193 nm, and may contact a liquid E having a refractive index of 1.64±0.01. For example, the liquid E according to this embodiment may be a liquid with a high refractive index, which is used in immersion exposure technology and is disclosed in "Second generation fluids for 193 nm immersion lithography," "High-Refractive-Index Fluids for the Next Generation ArF Immersion Lithography," and "Novel High Refractive Index Fluids for 193-nm immersion lithography".

The optical element 10 includes a base 12 composed of a LuAG substrate having a refractive index of 2.14±0.01 for the light B, and an antireflection film 20 formed on the base 12. For example, the optical element 10 is a final lens closest to a substrate in a projection optical system in an immersion exposure apparatus, or is a lens in a detection optical system for detecting focus etc. in a liquid in the immersion exposure apparatus. The LuAG substrate may be the LuAG substrate ($Lu_3Al_5O_{12}$) having a refractive index of 2.13, which is disclosed in "High-index optical materials for 193 nm immersion lithography."

The antireflection film 20 includes a high refractive index layer 22 and a low refractive index layer 24. Plural pairs of the two layers may be repetitively deposited in order of the high refractive index layer 22, the low refractive index layer 24, the high refractive index layer 22, the low refractive index layer 24 . . . . Another refractive index layer having a refractive index intermediate between those of the high and low refractive index layers may intervene between the high refractive index layer 22 and the low refractive index layer 24.

The high refractive index layer 22 is formed on the base, contains $Al_2O_3$ having a refractive index of 1.87 to 1.92 for the light B, and has an optical film thickness of $0.21\lambda$ to $0.34\lambda$. The low refractive index layer 24 is closer to the liquid than the high refractive index 22, contains $Al_2O_3$ having a refractive index of 1.78 or less but greater than that of the liquid for the light B, and has an optical film thickness of $0.29\lambda$ to $0.52\lambda$.

Figure 2:
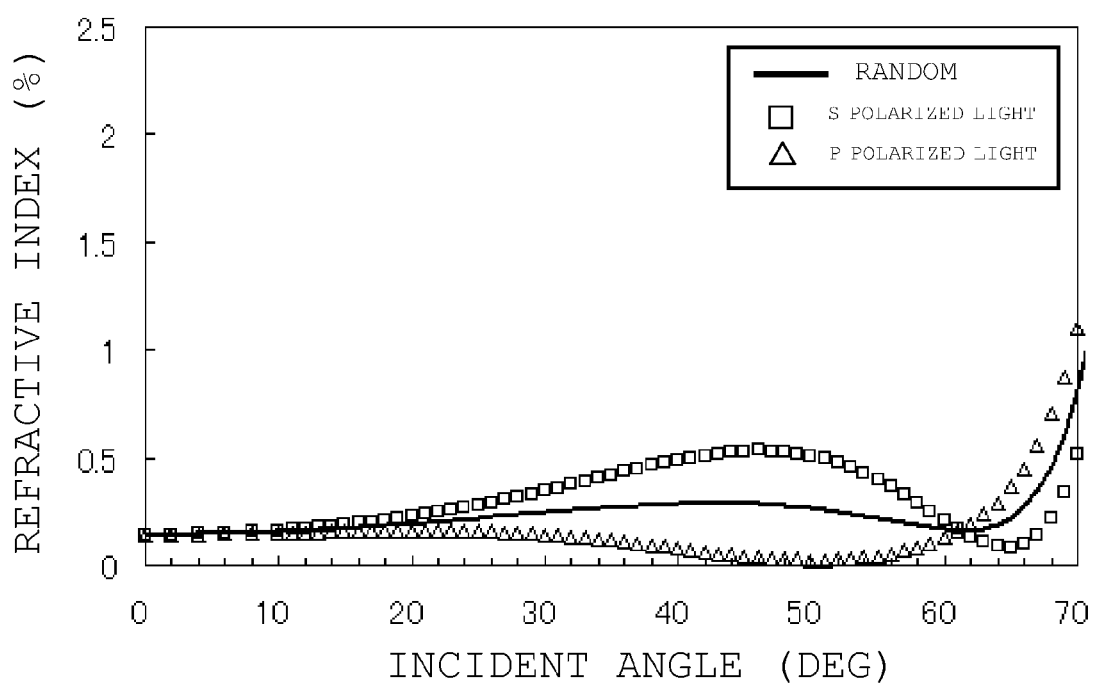
FIG. 2 is a graph which shows an incident angle characteristic of a reflectance on light of 193 nm when the optical element shown in FIG. 1 is immersed in the liquid.

FIG. 2 is a graph that shows an incident angle characteristic of the reflectance to the light B when the optical element 10 is immersed in the liquid E. The optical element 10 shown in FIG. 2 has the base 12 which uses the LuAG substrate having a refractive index of 2.14 for the light B, and is used with the liquid E having a refractive index of 1.64 on the light B. The optical element 10 laminates 30 nm of the high refractive index layer 22 composed of $Al_2O_3$ having the refractive index of 1.89 for the light B, and laminates 33 nm of the low refractive index layer 24 composed of $Al_2O_3$ having the refractive index of 1.74 for the light B. The light B uses unpolarized or random light, S-polarized light, and P-polarized light. As will be noted from FIG. 2, the refractive index is limited to 1% or less in an incident angle range between 0° and 70°.

This embodiment laminates the high refractive index layer 22 by an optical film thickness of $0.29\lambda$, which is composed of $Al_2O_3$ having a refractive index of 1.89 for the light B, on the base 12 that is composed of the LuAG substrate having a refractive index of 2.14 for the light B having a design center wavelength $\lambda$ of 193 nm. Next, the present invention laminates on the high refractive index layer 22, the low refractive index 24 by an optical film thickness of $0.30\lambda$, which is composed of $Al_2O_3$ having the refractive index of 1.89 for the light B. The optical element 10 having the incident angle characteristic shown in FIG. 2 may be obtained herewith.

This embodiment applies aluminum for a target, and forms the antireflection film by reactive magnetron sputter which uses an $O_2$ gas as the sputter gas. The sputter uses a pressure of 0.13 Pa to form the high refractive layer 22, and sets a $CF_4$ gas flow amount to 3.0 sccm during discharging so as to form the low refractive index layer 24.

Figure 3:
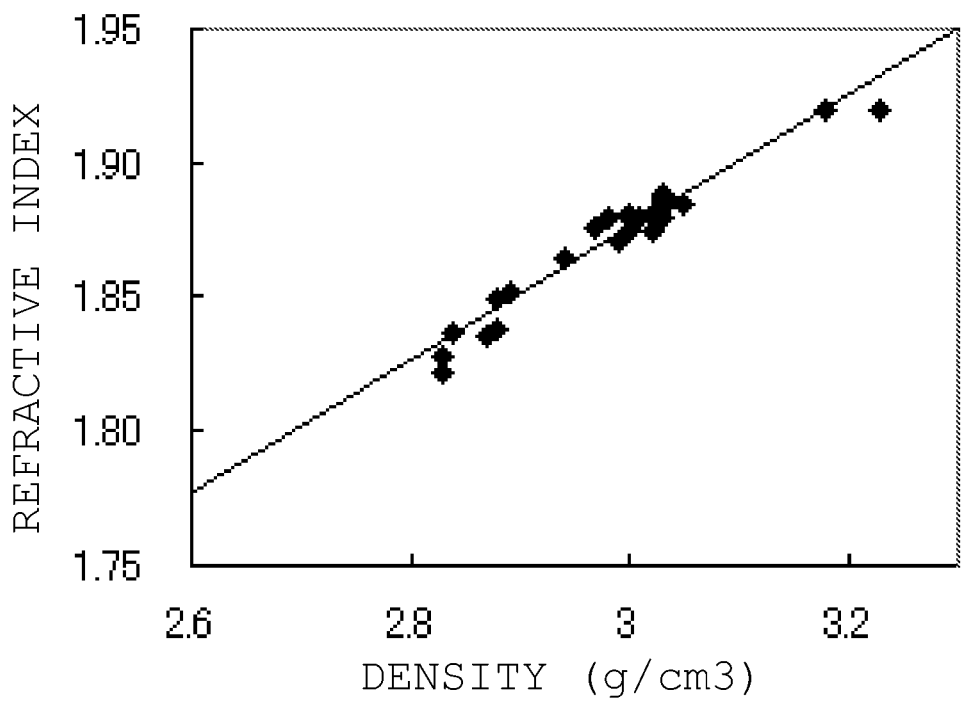
FIG. 3 is a graph which shows a relationship between a film density and a refractive index of an $Al_2O_3$ film formed by magnetron sputtering.

FIG. 3 is a graph which shows a relationship between a film density and a refractive index of an $Al_2O_3$ film formed by a magnetron sputtering apparatus. The thin film density is calculated from a critical angle the X-ray reflective spectrum (angle sweep). As will be noted from FIG. 3, the high refractive index layer 22 having the refractive index of 1.87 or greater for the light B maybe formed by increasing the film density of $Al_2O_3$ to 2.94 $g/cm^3$ or greater.

Figure 4:
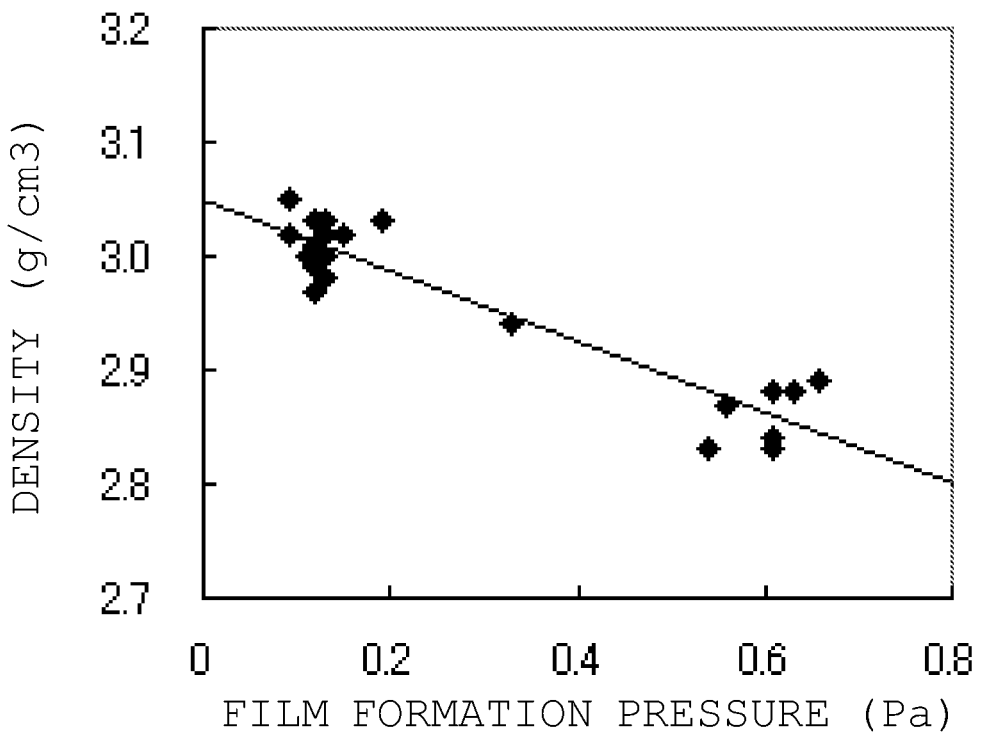
FIG. 4 is a graph which shows a relationship between a film formation pressure of a magnetron sputtering apparatus and the film density of the $Al_2O_3$ film.

According to the magnetron sputtering apparatus used in this embodiment, the film density depends on a film formation pressure. FIG. 4 is a graph which shows a relationship between the film formation pressure of the magnetron sputtering apparatus and the film density of the $Al_2O_3$ film. As will be noted from FIG.4, the $Al_2O_3$ film having the density of 2.94 $g/cm^3$ or greater may be obtained in the film formation with the film formation pressure of 0.33 Pa or less.

Figure 5:
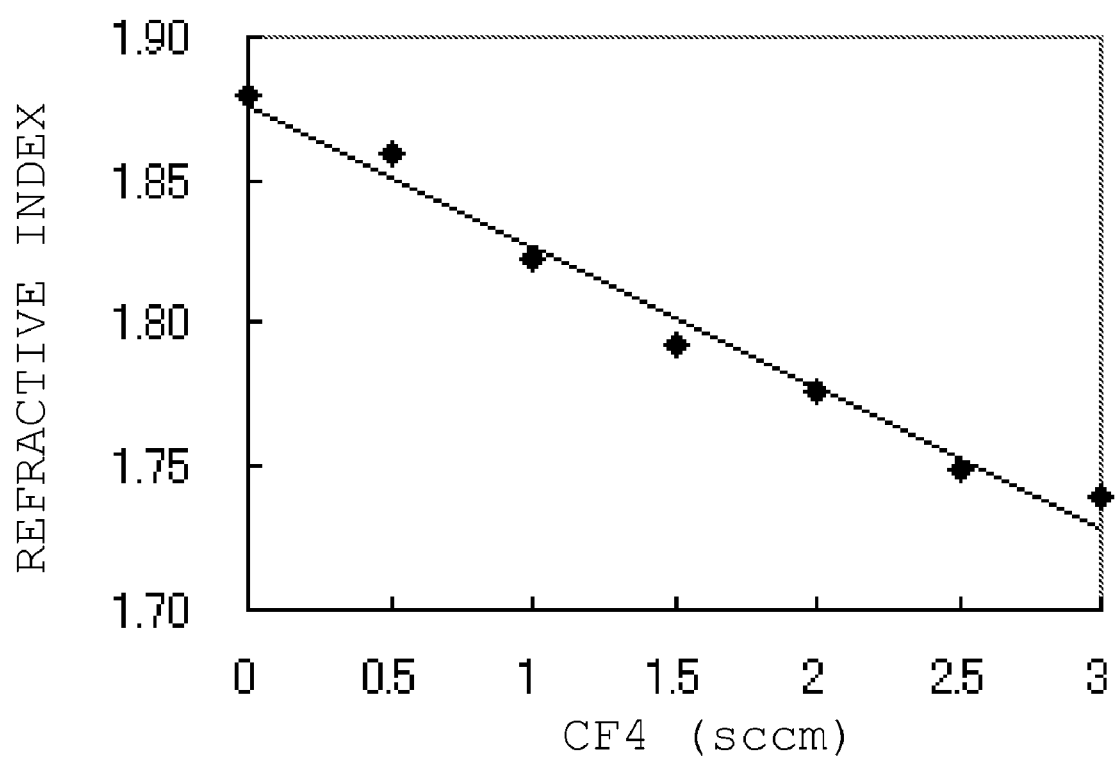
FIG. 5 is a graph which shows a relationship between a $CF_4$ gas flow amount and the refractive index of the $Al_2O_3$ film.

In the magnetron sputtering, one efficient method to add fluorine to the interior of $Al_2O_3$ is to add a $CF_4$ gas. FIG. 5 is a graph which shows a relationship between a $CF_4$ gas flow amount and the refractive index of the $Al_2O_2$ film. As will be noted from FIG. 5, the refractive index of the $Al_2O_3$ film may be controlled by controlling the $CF_4$ gas flow amount. It is also noted that the refractive index of the low refractive index layer 24 for the light B may be controlled within a range of between 1.74 and 1.78 by a $CF_4$ gas flow amount of between 1.85 sccm and 3 sccm as shown in FIG. 5.

Referring to FIG. 1, it appears that the low refractive index 24 having the refractive index of 1.78 or less for the light B may be generated by limiting the film density to 2.6 $g/cm^3$ or less. However, the smaller density leads to a lower mechanical strength and lower maintainability and, for example, causes no wiping available. Thus, the low refractive index layer 24 can be formed by adding fluorine.

An electron beam ("EB") evaporation method may be used instead of forming the $Al_2O_3$ film with magnetron sputtering as in this embodiment.

Figure 6:
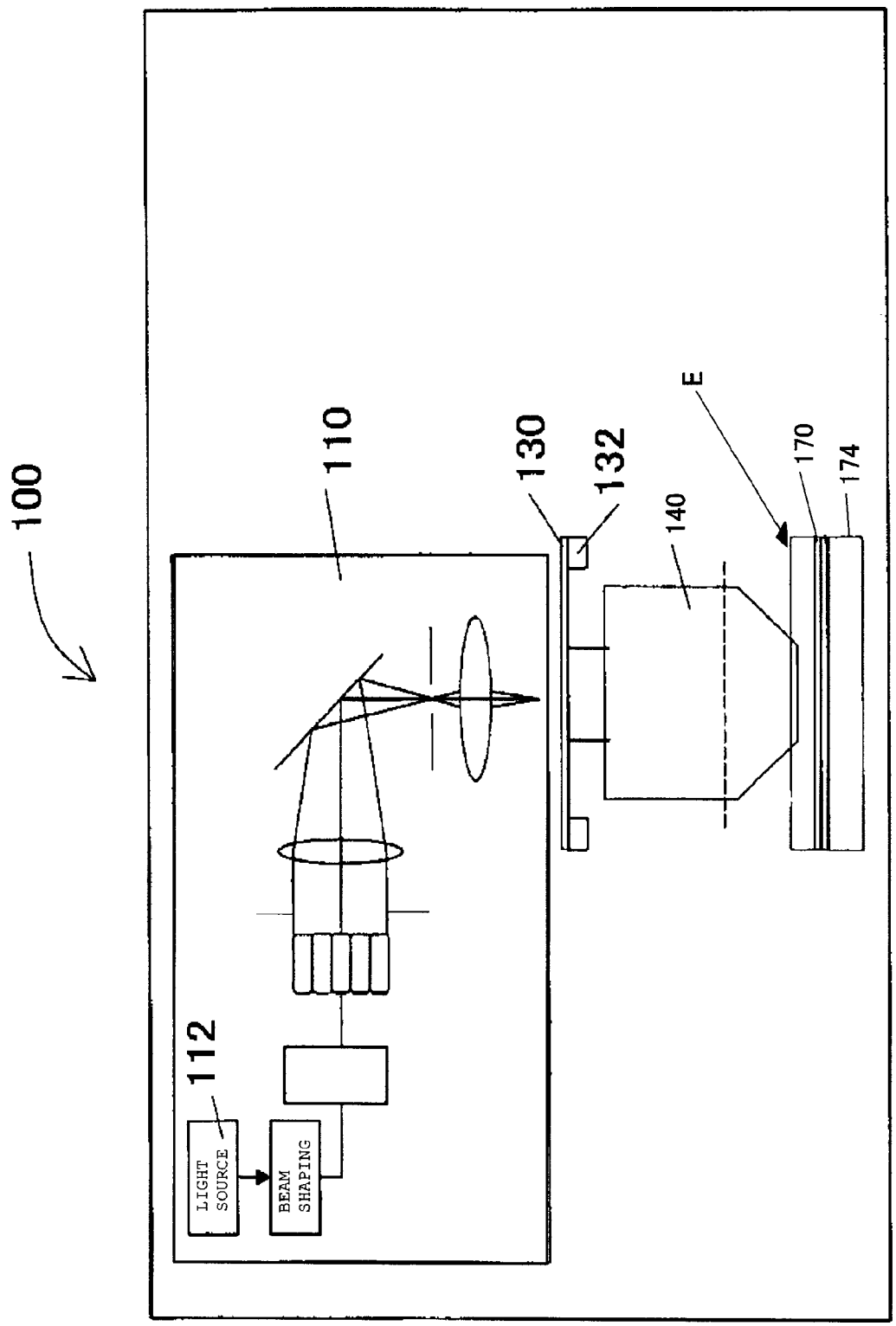
FIG. 6 is a block diagram of an exposure apparatus which applies the optical element shown in FIG. 1.

Referring now to FIG. 6, a description will be given of an exposure apparatus 100 which applies the optical element 10. Here, FIG. 6 is a schematic block diagram of the exposure apparatus 100. As shown in FIG. 6, the exposure apparatus 100 includes an illumination apparatus 110, a reticle 130, a reticle stage 132, a projection optical system 140, a wafer 170, and a wafer stage 174. The exposure apparatus 100 is an immersion exposure apparatus which partially or entirely immerses an end surface of a final optical element in the projection optical system 140, which faces the wafer 170 side, in the liquid E, and exposes a pattern of the reticle 130 on the wafer 170 via the liquid E. The exposure apparatus 100 is a step-and-scan projection exposure apparatus but the present invention may apply a step-and-repeat method or any other exposure methods.

The illumination device 110 includes a light source 112 and an illumination optical system and illuminates the reticle 130 that has a circuit pattern to be transferred. The light source 112 uses the ArF excimer laser having the wavelength of 193 nm. The illumination optical system uniformly illuminates the reticle 130. The reticle 130 has a circuit pattern to be transferred, and is supported and driven by the reticle stage 132. Diffraction beams emitted from the reticle 130 pass the projection optical system 140 and are projected onto the wafer 170. The reticle 130 and the wafer 170 are arranged in an optically conjugate relationship. Since the exposure apparatus 100 is a step-and-scan exposure apparatus or scanner, it scans the reticle 130 and the wafer 170 by scanning the reticle 130 and the wafer 170 with the light.

Figure 7:
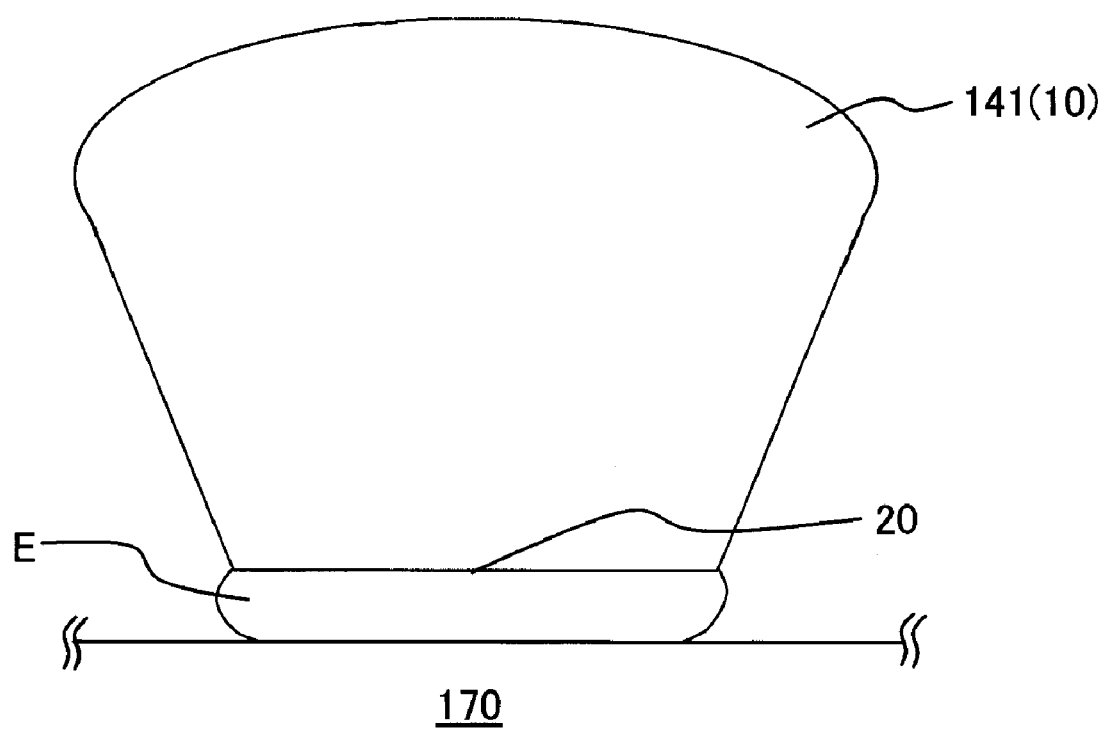
FIG. 7 is a schematic enlarged sectional view of a final lens in a projection optical system in the exposure apparatus shown in FIG. 6.

The projection optical system 140 has a function that images onto the wafer 170 the diffraction beams that have passed the pattern of the reticle 130. FIG. 7 is a schematic enlarged view of the optical element (the final lens) 141 in the projection optical system 140 closest to the wafer 170. The optical element 10 shown in FIG. 1 may be applied to the lens 141. The bottom of the lens 141 coincides with a region on which the pattern of the wafer 170 is projected (an exposure slit domain) during exposure. However, the bottom of the lens 141 may also cover a larger area than that of the exposure slit domain to shield light outside the domain. The bottom surface of the lens 141 is not limited to a flat surface.

In another embodiment, a liquid crystal substrate or other substrates may replace the wafer 170. A photo resist is applied on the substrate of the wafer 170. The wafer stage 174 supports and drives the wafer 170.

In exposure, the liquid E is continuously supplied to and recovered from a gap between the surface of the wafer 170 and the lens 141 of the projection optical system 140 after the gap is filled with the liquid E. Then, the reticle pattern is projected onto the wafer 170 via the projection optical system 140 and the liquid E. A medium in the wafer side of the projection optical system 140 is filled with the liquid E having the refractive index higher than that of the air. Thus, it will provide the projection optical system 140 with a larger NA, and reduces the resolution formed on the wafer 170. The antireflection film 20 on the final lens 141 (10) limits the reflectances for the incident angle range between 0° and 70° to 1% or less, and shields flare or ghost, ensuring precise critical dimension control. Thus, the exposure apparatus 100 will provide a high-quality device (such as a semiconductor device, a LCD device, an image sensor such as "CCD", and a thin film magnetic head) by a precise pattern transfer onto the resist.

A device such as a semiconductor integrated circuit device and a liquid crystal display device can be manufactured by the steps of exposing a photosensitizing agent applied substrate such as a wafer or a glass substrate by using the exposure apparatus in any of the above embodiments, developing the substrate, and any other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-219145, filed on Aug. 27, 2007, which is hereby incorporated by reference herein its entirety.

What is claimed is:

1. An optical element which includes a base composed of a LuAg substrate having a refractive index of 2.14±0.01 for a wavelength of 193 nm and an antireflection film formed on the base, and the optical element being configured to contact a liquid having a refractive index of 1.64±0.01 for the wavelength of 193 nm, said the antireflection film comprising:
    a high refractive index layer that is formed on the base, contains $Al_2O_3$ having a refractive index of 1.87 to 1.92 for the wavelength of 193 nm, and has an optical film thickness of $0.21\lambda$ to $0.34\lambda$ for a design center wavelength $\lambda$ of 193 nm; and
    a low refractive index layer that is closer to the liquid than the high refractive index layer, contains $Al_2O_3$ having a refractive index equal to or smaller than 1.78 but larger than the refractive index of the liquid for the wavelength of 193 nm, and has an optical film thickness of $0.29\lambda$ to $0.52\lambda$ at the design center wavelength $\lambda$.

2. An optical element according to claim 1, wherein the high refractive index layer is formed by magnetron sputtering, and has a film density of $Al_2O_3$ of 2.94 $g/cm^3$ or greater.

3. An optical element according to claim 1, wherein the low refractive index layer is formed by magnetron sputtering with a $CF_4$ gas that has a flow amount between sccm and 3 sccm.

4. An optical system having the optical element according to claim 1.

5. An exposure apparatus having the optical element according to claim 1.

6. A device manufacturing method comprising the steps of:
    exposing a substrate by using the exposure apparatus according to claim 5; and
    developing the substrate that has been exposed.

* * * * *